United States Patent
Ohshita et al.

(10) Patent No.: US 7,088,317 B2
(45) Date of Patent: Aug. 8, 2006

(54) METHOD FOR AGING DISPLAY APPARATUS AND ELECTRONIC EQUIPMENT USING THE METHOD

(75) Inventors: Isamu Ohshita, Yamagata (JP); Teruichi Watanabe, Yamagata (JP); Kunizo Ogoshi, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 304 days.

(21) Appl. No.: 10/245,305

(22) Filed: Sep. 18, 2002

(65) Prior Publication Data

US 2003/0184503 A1 Oct. 2, 2003

(30) Foreign Application Priority Data

Mar. 29, 2002 (JP) .......................... P2002-093676

(51) Int. Cl.
*G09G 3/30* (2006.01)
(52) U.S. Cl. ...................................... 345/77; 315/169.3
(58) Field of Classification Search ............ 345/76–78, 345/690, 691, 214, 215, 82–83; 315/169.3; 445/3, 6

See application file for complete search history.

(56) References Cited

U.S. PATENT DOCUMENTS

| 3,687,513 | A | * | 8/1972 | Holz ............................ 445/6 |
| 4,818,913 | A | * | 4/1989 | Isaka et al. .................... 445/6 |
| 6,337,542 | B1 | * | 1/2002 | Hanaki et al. ................ 345/76 |
| 6,424,326 | B1 | * | 7/2002 | Yamazaki et al. ............ 345/76 |
| 2002/0123291 | A1 | * | 9/2002 | Miyashita et al. ............. 445/6 |

FOREIGN PATENT DOCUMENTS

JP 2003-280547 10/2003

\* cited by examiner

*Primary Examiner*—Ricardo Osorio
(74) *Attorney, Agent, or Firm*—Sughrue Mion, PLLC

(57) ABSTRACT

An aging method applied to a display apparatus having light emitting devices arrayed, includes the steps of: setting integral driving time for the light emitting devices based on a property of luminance deterioration of the light emitting devices relative to the integral driving time so that the lowering of luminance per unit time is not larger than a set value; and driving and aging the light emitting devices only for the set integral driving time.

19 Claims, 5 Drawing Sheets

METHOD FOR AGING DISPLAY APPARATUS AND ELECTRONIC EQUIPMENT USING THE METHOD

BACKGROUND OF THE INVENTION

1. Field of the Invention

The present invention relates to a method for aging a display apparatus and electronic equipment using the aging method.

2. Description of the Related Art

It has been known that the display properties of a self-luminous display apparatus are generally unstable at an initial stage of use due to various factors. Therefore, an aging process for continuously driving the display apparatus for a predetermined time till the unstable display properties of the display apparatus are stabilized is typically carried out in a factory after a manufacturing process.

For example, in a cathode ray tube display apparatus (CRT), the luminance property and the deflection property are extremely unstable in an initial stage of use. In manufacturing the CRT, therefore, an aging process is carried out in the stage where respective parts and circuit boards have been set, so that the fluorescent screen of the CRT is controlled to display a full white screen with high luminance before video adjustment. This aging process is continuously performed till an output close to a set value can be obtained stably in response to a set input.

Also in a plasma display panel apparatus (PDP), a large variation in the luminescent property and the discharge property in an initial stage of use appears with the passage of time. Therefore, an aging process for driving the PDP for a predetermined time is carried out to stabilize the luminescent property and the discharge property. It is considered that the variation in properties of the PDP in an initial stage of use is caused by the influence of impurity gas staying behind in the discharge space after evacuation and by the fact that the surface state of a protective layer (MgO layer) facing the discharge space and having a function as a cathode for discharge changes in the initial stage. Accordingly, the process time of the aging process in the PDP is set in consideration of the time required for releasing/removing the impurity gas by the effect of discharge plasma to thereby clean the discharge space and in consideration of the time for the surface change of the protective layer to converge.

Many kinds of self-luminous display apparatus have been developed in recent years. In some of them, the luminance for a fixed input deteriorates conspicuously in an initial stage of use. In the display apparatus showing such properties, there arises problems different from the problem caused by the CRT or PDP in the initial stage, as follows.

That is, when light emitting devices disposed as components of the display apparatus are partially turned on and partially turned off in an initial stage of use in accordance with a pattern to be displayed on the screen, there occurs a large difference in luminance between the turned-on light emitting devices and the turned-off light emitting devices. Thus, there occurs a phenomenon that this difference results in the image persistence of the pattern staying on the display screen for some time. This phenomenon appears conspicuously particularly when a static image having a fixed pattern is displayed in an initial stage of use.

In addition, also when the display apparatus is a full-color or area-color display apparatus in which light emitting devices of respective colors of R, G and B have been arrayed, there occurs a similar image persistence phenomenon. In such a color display apparatus, the degree of deterioration in one of the colors in an initial stage of use often differs from that in another color. As a result, there is a problem that there occurs an image persistence phenomenon further including color unevenness.

To cope with such problems, it can be considered to still carry out an aging process in an initial stage of use in the same manner as in the display apparatus described above. However, in the present circumstances, there is no particular investigation made into the method for setting the process time or driving the apparatus for the aging process, and no aging process required for avoiding the image persistence phenomenon is carried out. Further, when the process time is set to be longer than necessary, the management time in a manufacturing factory increases. It is therefore considered that there is another problem that the manufacturing cost increases.

Further, particularly in an organic EL display apparatus, it has been confirmed that the degree of deterioration in luminance in an initial stage of use varies in accordance with the kind of luminescent material forming light emitting devices. In the present circumstances, material selection is made to avoid materials that deteriorate extremely and conspicuously in luminance in an initial stage of use, in order to prevent the image persistence phenomenon. However, with such material selection, materials having good progress of luminance in a stable stage or materials showing excellent properties for other factors such as a luminescent property or a coloring property cannot be selected. Thus, there occurs a problem that the range of material selection is narrowed in the material design for improving the display performance as a whole.

SUMMARY OF THE INVENTION

The invention was proposed to cope with such circumstances. It is an object of the invention to provide an aging method which can prevent an image persistence phenomenon from occurring in a display apparatus having conspicuous deterioration in luminance in an initial stage of use. It is another object of the invention to provide electronic equipment having a display apparatus in which this aging method is adopted so that the manufacturing cost can be reduced while the range of material selection of light emitting devices is expanded so that the display performance can be improved.

In order to attain the foregoing objects, the invention has features as follows.

(1) According to the invention, there is provided a method for aging a display apparatus having light emitting devices arrayed, having the steps of setting integral driving time for the light emitting devices based on a property of luminance deterioration of the light emitting devices relative to the integral driving time so that lowering of luminance per unit time becomes not larger than a set value, and driving and aging the light emitting devices only for the set integral driving time.

(2) According to the invention, there is provided a method for aging a display apparatus as in (1), wherein the driving and aging is performed by entire lighting of the light emitting devices.

(3) According to the invention, there is provided a method for aging a display apparatus as in (1), wherein the driving and aging is performed by displaying a plurality of different image patterns while changing the image patterns at an interval of short time.

(4) According to the invention, there is provided a method for aging a display apparatus as in (1), wherein the display apparatus is constituted by arrayed light emitting devices of respective colors of R, G and B, and the light emitting devices of the colors of R, G and B are driven and aged with the integral driving time set for each of the colors of R, G and B.

(5) According to the invention, there is provided a method for aging a display apparatus as in (1), wherein the display apparatus is constituted by arrayed light emitting devices of respective colors of R, G and B, and the light emitting devices of one of the colors of R, G and B are driven and aged with luminance different from that for the light emitting devices of another of the colors.

(6) According to the invention, there is provided a method, for aging a display apparatus as in anyone of (1) to (5), wherein the light emitting devices are organic EL devices.

In (7) to (15), description is made on electronic equipment having a display apparatus performing an aging process using the aging method.

(7) According to the invention, there is provided electronic equipment including: a display apparatus having light emitting devices arrayed; and a drive control unit actuated in an initial stage of use of the electronic equipment so as to drive and age the light emitting devices while integrating driving time of the light emitting devices after initial driving; wherein integral driving time of the light emitting devices is set based on a property of luminance deterioration of the light emitting devices relative to the integral driving time so that the lowering of luminance per unit time becomes not larger than a set value, and the drive control unit is actuated till time integrated by the drive control unit comes to the set integral driving time.

(8) According to the invention, there is provided electronic equipment as in (7), wherein the driving and aging by the drive control unit is performed by entire lighting of the light emitting devices.

(9) According to the invention, there is provided electronic equipment as in (7), wherein the driving and aging by the drive control unit is performed by displaying a plurality of different image patterns while changing the image patterns at an interval of short time.

(10) According to the invention, there is provided electronic equipment as in (7), wherein the display apparatus is constituted by arrayed light emitting devices of respective colors of R, G and B, and the drive control unit drives and ages the light emitting devices of the colors of R, G and B only for the integral driving time set for each of the colors of R, G and B.

(11) According to the invention, there is provided electronic equipment as in (7), wherein the display apparatus is constituted by arrayed light emitting devices of respective colors of R, G and B, and the drive control unit drives and ages the light emitting devices of one of the colors of R, G and B with luminance different from that for the light emitting devices of another of the colors.

(12) According to the invention, there is provided electronic equipment as in any one of (7) to (11), wherein the drive control unit is actuated when a charging power supply of a secondary battery for supplying driving power to the electronic equipment is in connection to the electronic equipment.

(13) According to the invention, there is provided electronic equipment as in any one of (7) to (12), further including a unit by which a user can interrupt aging during the integral driving time.

(14) According to the invention, there is provided electronic equipment as in any one of (7) to (13), further including a unit for clearly showing a user of the electronic equipment that the drive control unit is operating.

(15) According to the invention, there is provided electronic equipment as in any one of (7) to (14), wherein the light emitting devices are organic EL devices.

The advantages of the invention configured thus in (1) to (15) will be described below.

First, the method for aging a display apparatus according to (1) to (6) is an aging method carried out in an initial stage of use of the display apparatus either in or out of a manufacturing factory of the display apparatus. The aging method can prevent an image persistence phenomenon which occurs in the display apparatus having conspicuous deterioration in luminance in the initial stage of use as described above.

According to the method as in (1), the integral driving time is set for defining the aging process time based on the luminance deterioration property of light emitting devices as components of the display apparatus. The luminance deterioration property of the light emitting devices as components of the display apparatus causes the image persistence phenomenon. This luminance deterioration property is a property in which sharp deterioration is shown in the, initial stage of use, and after that, the deterioration develops gradually, but slows down in terms of the degree. On the other hand, such a luminance deterioration property can be determined uniquely from known factors that can be obtained when the display apparatus is designed. The known factors include the material and the emission color of the light emitting devices, and the driving system. Accordingly, the luminance deterioration property of the light emitting devices relative to the integral driving time can be obtained in the stage of design of the display apparatus. Thus, the integral driving time is set based on this luminance deterioration property so that the lowering of the luminance per unit time becomes not larger than a predetermined value. In such a manner, the aging process time for preventing the image persistence phenomenon can be defined.

According to the method as in (2) or (3), while the integral driving time is set as described above, a driving and aging method effective in preventing the image persistence phenomenon is specified. According to the method as in (2), entire lighting is carried out to supply a predetermined input to all the arrayed light emitting devices at one time, so that the development of the sharp luminance deterioration in the initial stage of use is completed before a specific pattern is displayed. Accordingly, the development of the luminance deterioration in the light emitting devices has slowed down in normal use for displaying various patterns. Thus, the image persistence phenomenon can be prevented.

According to the method as in (3), a plurality of different image patterns are displayed on the display screen of the display apparatus having the light emitting devices arrayed, while changing the image patterns at an interval of short time. Thus, all the light emitting devices emit light at random in the initial stage of use. Accordingly, in the normal use for displaying a specific static pattern such as a menu screen or a wait screen for along time, all the light emitting devices have deteriorated substantially uniformly so that the development of the luminance deterioration has slowed down. Thus, the image persistence phenomenon can be prevented.

The methods as in (4) and (5) were invented for a full-color or area-color display apparatus constituted by arrayed light emitting devices of respective colors of R, G and B, taking it into consideration that the deterioration property of the light emitting devices of one color differed from that of the light emitting devices of another color. According to the method as in (4), while the integral driving time is set for each color as described above, the light emitting devices of the color is driven only for the set time in the driving method effective in preventing the image persistence phenomenon. Accordingly, it is possible to prevent the image persistence phenomenon including color unevenness. According to the method as in (5), in the case where the deterioration property of the light emitting devices of one color differs from that of the light emitting devices of another color, the luminance of one color is made different from that of another color when the light emitting devices are driven and aged. Thus, it is possible to make the process time of one color equal to that of another color.

According to the method as in (6), the light emitting devices are specified as organic EL devices. Organic EL devices are typical light emitting devices showing the luminance deterioration property. By adopting the aging method, the image persistence phenomenon can be prevented in an organic EL display apparatus. Thus, even if light emitting devices showing a sharp luminance deterioration property in an initial stage of use are used, there will be no problem in the image persistence phenomenon. Accordingly, the range of material selection in luminescent material or the like for forming the light emitting devices is expanded so that the material design can be made in consideration of the display performance as a whole.

Electronic, equipment as in (7) to (15) is electronic equipment having a unit for carrying out the aging method specified in (1) to (6). Thus, the aging process for preventing the image persistence phenomenon can be carried out not only in a manufacturing factory but also after the electronics equipment has been shipped out of the factory. Accordingly, the management time and the management space in the manufacturing factory can be saved so that the manufacturing cost can be reduced.

In the electronic equipment as in (7), a drive control unit for driving and aging light emitting devices while integrating driving time of the light emitting devices after initial driving is provided in the equipment. Then, the integral driving time is set in advance as described previously. The driving and aging of the light emitting devices is started by the drive control unit actuated in an initial stage of use. The driving and aging is terminated when the driving time integrated by the drive control unit comes to the set integral driving time.

The electronic equipment as in (8) to (11) is to carry out the aging methods defined in (2) to (5), respectively.

In the electronic equipment as in (12), the drive control unit is actuated when a charging power supply is in connection to the electronic equipment. Thus, the aging process is carried out at the time of charging before a user uses the electronic equipment.

In addition, the electronic equipment as in (13) is designed so that the user can interrupt aging during the integral driving time for carrying out the aging process. Thus, it can be judged by the user's will whether the aging process is carried out completely or use is given priority over the aging process even if the aging process is incomplete.

Further, in the electronic equipment as in (14), the user of the electronic equipment is clearly showed that the aging process is being carried out. Thus, the user is prevented from mistaking the operation of the aging process for a failure of the equipment.

DETAILED DESCRIPTION OF THE PREFERRED EMBODIMENTS

An embodiment of the invention will be described below with reference to the drawings. In the embodiment shown here, an organic EL display apparatus will be described as a display apparatus by way of example. As described previously, however, the invention is not limited to this, but the invention is applicable to a display apparatus constituted by other light emitting devices showing a similar luminance deterioration property.

Figure 1:
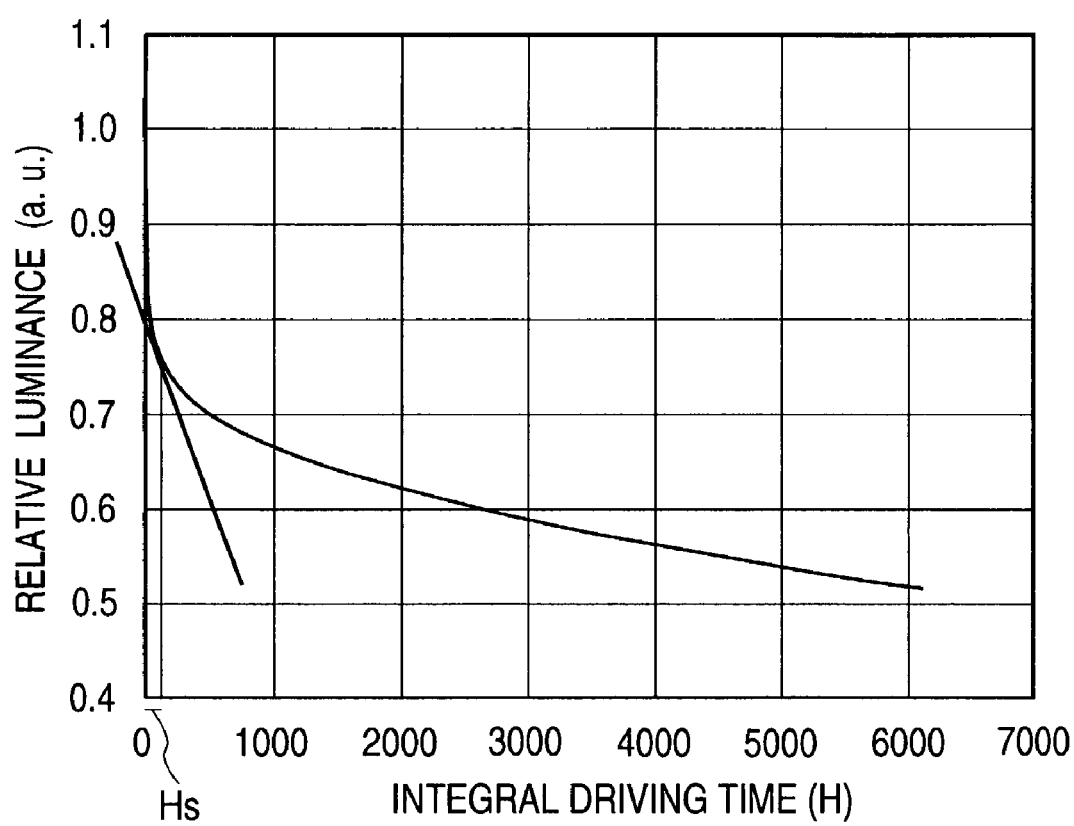
FIG. 1 is a graph for explaining a method for aging a display apparatus according to an embodiment of the invention, showing the luminance deterioration property of an organic EL device.

FIG. 1 is a graph for explaining a method for aging a display apparatus according to an embodiment of the invention, showing the luminance deterioration property of an organic EL device. In FIG. 1, the ordinate designates the integral driving time after the initial stage of use, and the abscissa designates the relative luminance (where the luminance in the initial stage of use is regarded as 1) when a fixed input is applied during the integral driving time. As is apparent from FIG. 1, the organic EL device shows a sharp luminance deterioration property for several tens of hours after the initial stage of use. After that, the deterioration develops gradually, but the degree of the deterioration slows down.

Such a luminance deterioration property varies in accordance with the material of the light emitting device. In addition, even with the same material, the luminance deterioration property generally varies in accordance with the driving system adopted. For example, there is a tendency that the inclination of the luminance deterioration in the initial stage by active matrix driving is larger than that by passive matrix driving. It is, however, known that as the integral light emission time increases, the inclination of the luminance deterioration becomes considerably small in the active matrix driving in comparison with that in the passive matrix driving. By processing such a property statistically, the luminance deterioration property can be specified for each material of light emitting devices.

Then, integral driving time Hs with which the lowering of luminance per unit time takes a set value $\theta s$ is set in accordance with the specified luminance deterioration property as shown in FIG. 1. Thus, the aging process time can be determined on the basis of the integral driving time Hs.

Figure 2:
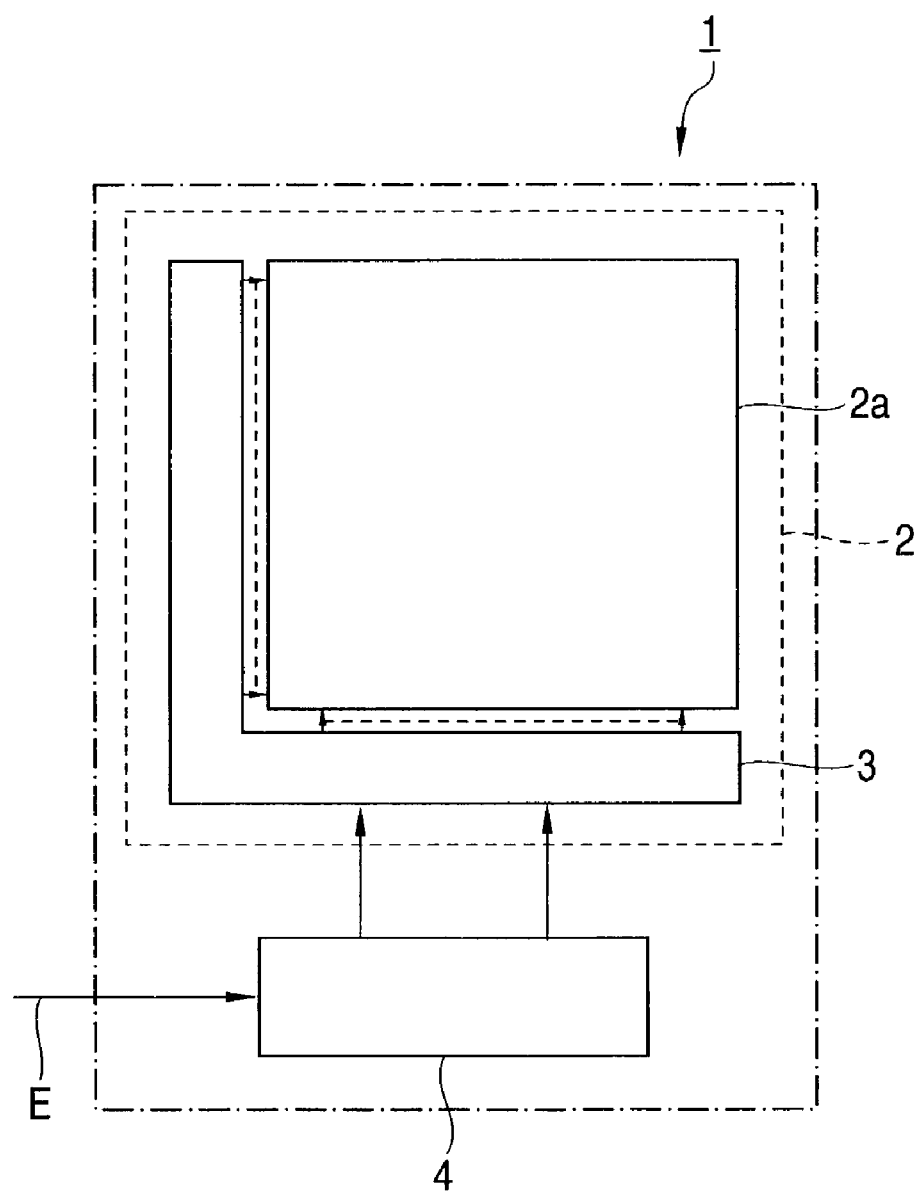
FIG. 2 is a system configuration diagram for carrying out the method for aging the display apparatus according to the embodiment of the invention.

FIG. 2 is a system configuration diagram for carrying out the method for aging the display apparatus according to the embodiment of the invention. An organic EL display apparatus 1 (active matrix driving type) is constituted by a display panel portion 2, a drive circuit 3, and a display control portion 4. The display panel portion 2 is formed on an active matrix substrate. The drive circuit 3 drives each TFT of a light emitting device area 2a in the display panel portion 2. The display control portion 4 supplies signals or power to the drive circuit 3. When the drive circuit 3 is driven by a driver driving signal from the display control portion 4, each TFT of the light emitting device area 2a is driven by a device driving signal from the drive circuit 3.

Figure 3:
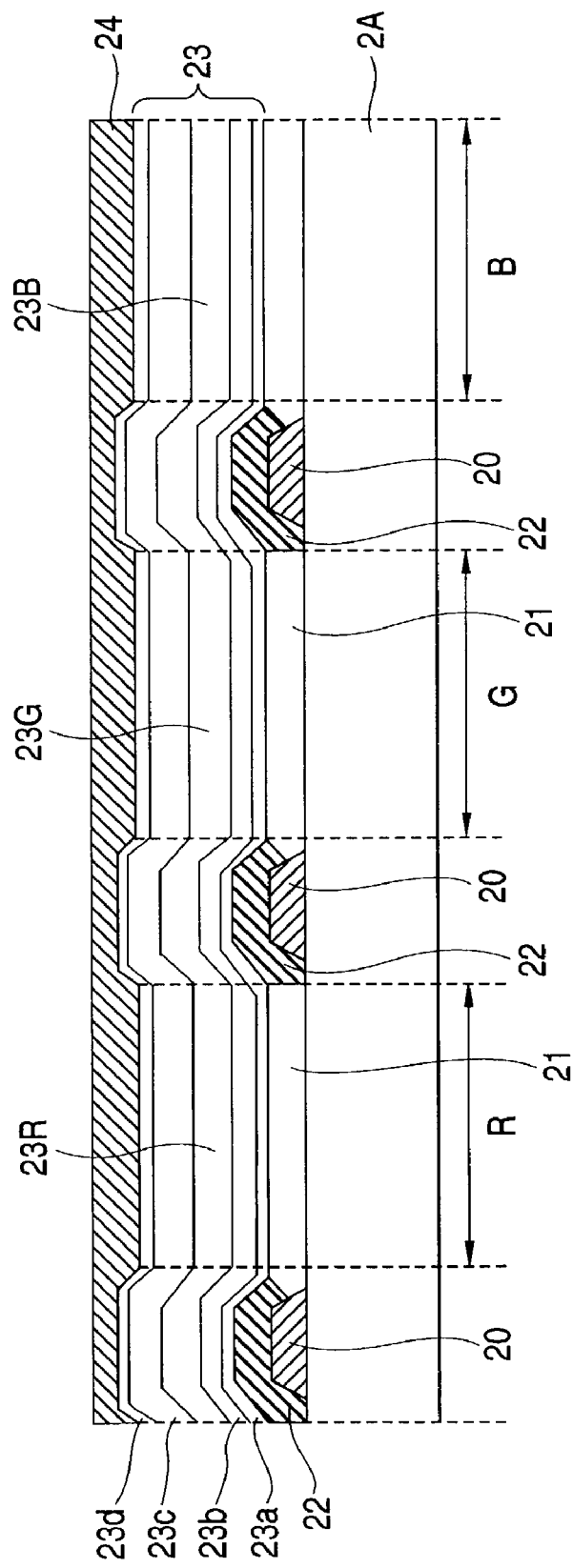
FIG. 3 is an explanatory view showing the structure of a display panel portion according to the embodiment.

FIG. 3 is an explanatory view showing the structure of the light emitting device area 2a. Here, a full-color display panel in which R, G and B are driven independently of one another will be described by way of example. TFTs 20 are formed on an active matrix substrate 2A made of transparent glass or the like. Further, transparent electrodes (anodes) 21 made of a transparent conductive material such as ITO are formed for the respective devices separately from one another. An insulating film 22 made of polyimide or the like is formed between the transparent electrodes 21. Then, a plurality of organic compound material layers 23 are formed on the transparent electrodes 21, and a metal electrode (cathode) 24 made of Al or the like is formed over the organic compound material layers 23.

The organic compound material layers 23 are composed of positive hole transportation functional layers (a positive hole injection layer 23a and a positive hole transportation layer 23b) formed on the transparent electrodes 21 and the insulating layers 22 on the active matrix substrate 2A, luminescent layers 23B, 23G and 23R formed thereon, and electron transportation functional layers (an electron transportation layer 23c and an electron injection layer 23d) formed thereon. The luminescent layers 23B, 23G and 23R are made of different organic compound materials so as to emit light in different colors.

Here, the areas indicated by the arrows between the broken lines designate luminescent areas of colors R, G and B respectively. The luminescent areas of the colors R, G and B form light emitting devices as pixels respectively. The light emitting devices arrayed on the active matrix substrate 2A are driven as a dot matrix by the drive circuit 3. Thus, a full color image can be obtained.

Figure 4:
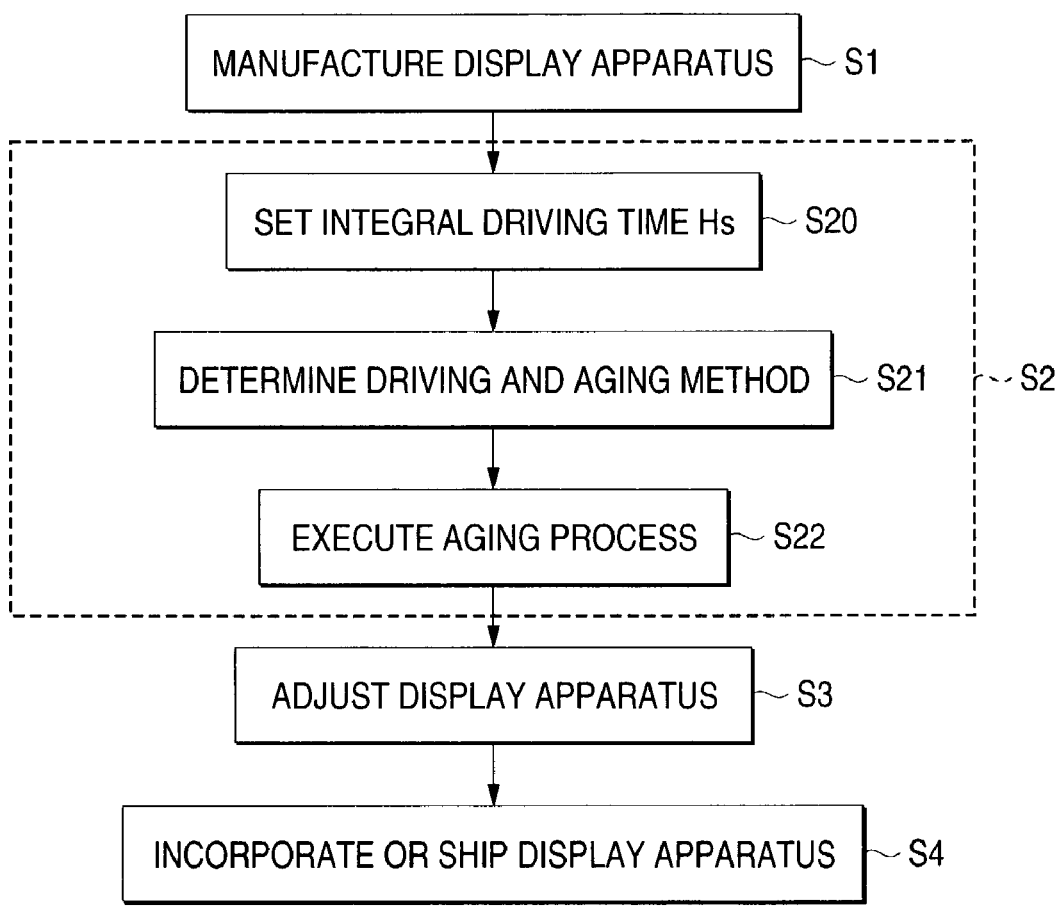
FIG. 4 is a flow chart showing the procedure of the aging method according to the embodiment.

An aging process signal E is supplied to the display control portion 4 of the organic EL display apparatus 1 configured thus so as to carry out an aging process. The procedure of the aging process will be described with reference to the flow chart of FIG. 4. For the organic EL display apparatus 1 having a structure described above, the light emitting device area 2a is formed on the active matrix substrate 2A, and the drive circuit 3 and the display control portion 4 are incorporated so that the manufacture of the organic EL display apparatus 1 is completed (S1). After that, an aging process apparatus (not shown) is connected to the display control portion 4 so as to carry out an aging process (S2).

In this aging process (S2), set integral driving time Hs with which the lowering of luminance per unit time becomes not larger than a set value (θs) is obtained from the deterioration property (S20). Thus, the process time is determined. This set integral driving time Hs is obtained uniquely in accordance with the material of the light emitting devices and the form of driving (driving system, driving duty, and so on). Thus, in a monochromatic display apparatus, the set integral driving time Hs can be set as one set value corresponding to the design of the display apparatus.

On the other hand, in the full-color display apparatus or area-color display apparatus in which light emitting devices of respective colors R, G and B have been arrayed, the integral driving time Hs is set for each color. Here, a color display apparatus in which the light emitting devices of one color are driven independently of the light emitting devices of another color is aimed at, and the luminance deterioration property of the light emitting devices of one color is generally different from that of the light emitting devices of another color. Thus, the integral driving time Hs of one of the colors R, G and B with which the relative luminance lowering per unit time becomes a fixed set value θs differs from that of another color. It is therefore necessary to set integral driving times $Hs_R$, $Hs_G$ and $Hs_B$ for the respective colors based on the deterioration properties of the respective colors.

Next, the driving and aging method is determined (S21). As the driving and aging method, entire-lighting driving by which a predetermined input is supplied to all the arrayed light emitting devices at one time is carried out by way of example. When the display apparatus is constituted by monochromatic light emitting devices, all the light emitting devices are driven continuously only for the set integral driving time Hs by a fixed input. For another example, a plurality of different image patterns are displayed on the display screen of the display apparatus having the light emitting devices arrayed, while changing the image patterns at an interval of short time. Thus, all the light emitting devices emit light at random in the initial stage of use. In this case, driving is controlled so that the integrated lighting time of each of the light emitting devices is equal to the set integral driving time Hs.

Further, in a color display apparatus, light emitting devices of respective colors may be full-lit independently and correspondingly to the integral driving times $Hs_R$, $Hs_G$ and $Hs_B$ set for the colors respectively. In this case, however, there occurs a difference in process time among the respective colors. Accordingly, the luminance at the time of lighting for one color may be made different from that for another color (the longer the integral driving time Hs for the color is, the higher the luminance is made). Thus, the process time can be made uniform among the respective colors. Alternatively, as described previously, a plurality of different image patterns may be displayed while being changed at an interval of short time. In this case, when the driving duty of each pattern for each color is adjusted, the integrated lighting time, of each color can be equal to its corresponding set integral driving time $Hs_R$, $Hs_G$, $Hs_B$. In addition, the process time can be made uniform among the respective colors.

When the aging process is executed (S22), the integral driving time Hs is set and the driving and aging method is selected. Then, a driving and aging signal is transmitted to the display control portion 4 while the driving time is integrated. Alternatively, aging data (display data for aging and set integral driving time) may be stored in a memory in the display control portion 4 in advance. In this case, in response to an aging process signal E, a driving signal is supplied from the display control portion 4 to the drive circuit 3 in accordance with the aging data.

When such an aging process S2 is terminated, the luminance deterioration of the organic EL display apparatus 1 has slowed down. Thus, various kinds of adjustment such as driving current adjustment are carried out on the display apparatus (S3), and the organic EL display apparatus 1 is incorporated in various kinds of electronic equipment or shipped as a stand-alone display apparatus (S4).

Figure 5:
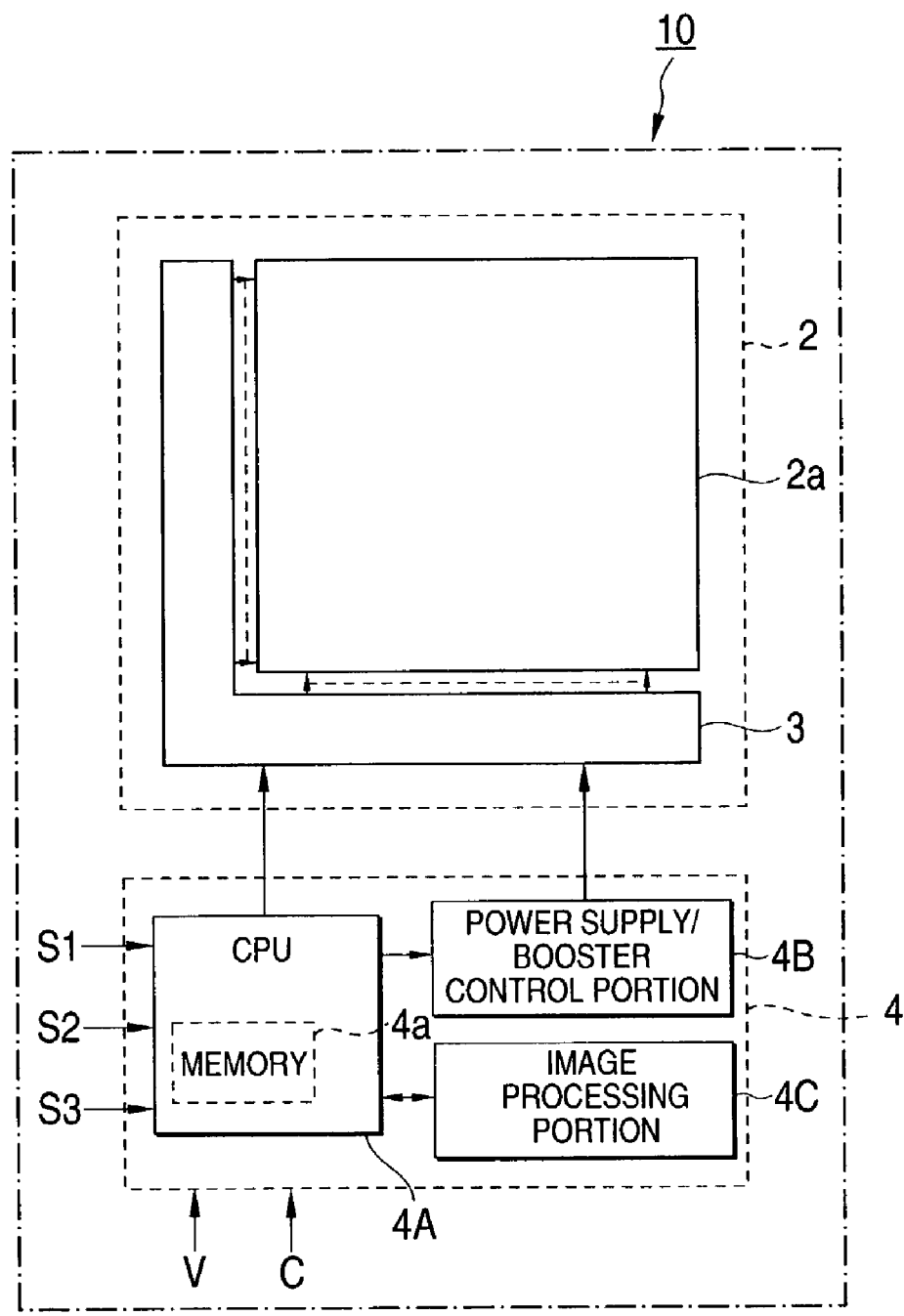
FIG. 5 is an explanatory view showing electronic equipment having the display apparatus according to the embodiment.

Next, description will be made on electronic equipment in which a unit for carrying out such an aging process has been incorporated, with reference to FIG. 5. Electronic equipment 10 has the organic EL display apparatus, constituted by the display panel portion 2 including the drive circuit 3, and the display control portion 4 as described previously.

Here, the display control portion 4 includes a drive control portion (CPU) 4A, a power supply/booster control portion 4B, an image processing portion 4C, a memory 4a, and so on. The display control portion 4 operates in accordance with driving power V and a clock signal C. Then, for normal display, a driving signal is supplied from the drive control portion 4A to the drive circuit 3 in accordance with the input of a video signal S3 as display information so that driving power is supplied from the power supply/booster control portion 4B to the drive circuit 3. Here, the driving power V is supplied from a secondary battery (not shown) such as a rechargeable battery. A charging power supply can be connected to this secondary battery.

Aging data is stored in the memory 4a of the electronic equipment 10 as described previously. The stored aging data includes the integral driving time Hs (integral driving times $Hs_R$, $Hs_G$ and $Hs_B$ for the respective colors in the case of a color display apparatus), an aging program, image data of aging patterns, and so on. As the aging patterns, either an image pattern for entire lighting or a plurality of different image patterns to be displayed while being changed at an interval of short time are stored. Alternatively, both of them are stored so that either of them can be chosen.

Then, the aging data in the memory 4a is managed by the drive control portion 4A. The drive control portion 4A is actuated by a charging sense signal S1 generated in response to the connection of the charging power supply to the secondary battery or a user's input sense signal S2 generated in response to a driving and aging request operation of the user. Thus, the aging program in the memory 4a is executed.

In the electronic equipment 10, an example of operation for carrying out an aging process will be described below. The integral drive time Hs is set as soon as the display apparatus is designed. The value of the set integral drive time Hs is stored by each of the colors R, G and B in the memory 4a. This value can be reset by the operation of the user through an equipment operating portion. Then, when the charging power supply is connected to the secondary battery of the electronic equipment 10, the charging sense signal S1 generated in response thereto is supplied to the drive control portion 4A so as to start driving and aging.

That is, in response to the input of the charging sense signal S1, the drive control portion 4A executes the aging program in the memory 4a so that image data of an aging pattern (for example, entire-lighting drive pattern) stored in the memory 4a is outputted for each color. Then, the drive circuit 3 is driven by the output from the drive control portion 4A so that the TFTs in the light emitting device area 2a are driven by driving signals for the respective colors independent of one another.

In addition, at the same time that the driving and aging is carried out, the driving time is integrated for each color. As soon as the integral driving time is equal to the integral drive time $Hs_R$, $Hs_G$, $Hs_B$ in the memory 4a, driving of the TFTs in the light emitting device area 2a is stopped for each color. In this example, the aging process time for one color differs from that for another color. However, the drive control portion 4 may control the output so that the luminance for one color differs from that for another color. Thus, the process time for one color can be equal to that for another color.

According to the electronic equipment 10 configured thus, the aging process can be applied to the organic EL display apparatus at desired timing before the equipment shipped from the manufacturing factory to a user is used normally. Accordingly, it is not necessary to provide a space for the aging process in the manufacturing factory, while the time of the aging process can be saved out of the manufacturing process. Thus, the manufacturing cost can be reduced on a large scale. Then, as for the aging process carried out under user's care, the user can reset the integral driving time Hs. Accordingly, it can be selected by the user's will whether the aging process is carried out completely or normal use is given priority over the aging process even if the aging process is incomplete.

Further, when the aging process under user's care is carried out automatically in association with the connection with a charging power supply or the like, it is effective that a display portion for clearly showing the user that the drive control portion 4A is engaging in driving and aging is provided to prevent the user from mistaking the driving in the aging process for a failure of the equipment. Alternatively, it is effective that display such as a denotation clearly showing that the aging process is carried out automatically is added to a connection portion with the charging power supply or the like.

In the organic EL display apparatus, the problem of the image persistence phenomenon can be prevented by the aging process carried out thus even if a material conspicuous in deterioration property in the initial stage of use is used as the material of the light emitting devices. Accordingly, it is possible to select the material regardless of its deterioration property in the initial stage of use. Thus, the range of selection on the material design is expanded in pursuit of the display performance.

Incidentally, it is effective that the aging method according to the invention is applied to an initial stage in which the luminance deterioration property is conspicuous as described previously. However, even if a similar aging process is carried out after the luminance deterioration property has shown a gentle curve, the effect can be recognized to some extent. Accordingly, the aging according to the invention is not limited only to the process carried out in the initial stage of use.

That is, according to the invention, for example, an aging mode can be also set in which a user can carry out aging when the user finds image persistence in the display apparatus in use. In this case, the aging may be carried out by the user for desired time till the degree of the image persistence is relieved.

According to the invention, with such a configuration, it is possible to provide an aging method which can prevent an image persistence phenomenon that occurs in a display apparatus with conspicuous luminance deterioration in an initial stage of use. In addition, by adopting this aging method, it is possible to provide electronic equipment having a display apparatus in which the manufacturing cost can be reduced, while the range of selection of the material of light emitting devices is expanded so that the display performance can be improved.

What is claimed is:

1. A method for aging a display apparatus having light emitting devices arrayed, comprising:
    setting an integral driving time for said light emitting devices based on a property of luminance deterioration of said light emitting devices relative to said integral driving time so that lowering of luminance per unit time becomes not larger than a set value; and
    driving and aging said light emitting devices, only for said set integral driving time, upon an aging request operation,
    wherein the driving and aging of the light emitting devices is performed in an operation separate from manufacturing of the display apparatus.

2. The method for aging a display apparatus according to claim 1, wherein said driving and aging is performed by entire lighting of said light emitting devices.

3. The method for aging a display apparatus according to claim 1, wherein said driving and aging is performed by displaying a plurality of different image patterns while changing said image patterns at an interval of short time.

4. The method for aging a display apparatus according to claim 1, wherein said display apparatus comprises arrayed light emitting devices of respective colors of R, G and B, and said light emitting devices of said colors of R, G and B are driven and aged with said integral driving time set for each of said colors of R, G and B.

5. The method for aging a display apparatus according to claim 1, wherein said display apparatus comprises arrayed light emitting devices of respective colors of R, G and B, and said light emitting devices of one of said colors of R, G and B are driven and aged with luminance different from that for said light emitting devices of another of said colors.

6. The method for aging a display apparatus according to claim 1, wherein said light emitting devices are organic EL devices.

7. The method for aging a display apparatus according to claim 1, wherein the aging request operation is initiated directly by an end user of the display apparatus.

8. Electronic equipment comprising:
a display apparatus comprising light emitting devices;
a drive control unit actuated in an initial stage of use of said electronic equipment so as to drive and age said light emitting devices while integrating a driving time of said light emitting devices after initial driving;
wherein an integral driving time of said light emitting devices is set based on a property of luminance deterioration of said light emitting devices relative to said integral driving time so that lowering of luminance per unit time becomes not larger than a set value, and
said drive control unit is actuated, upon an aging request operation, until the driving time integrated by said drive control unit comes to said set integral driving time,
wherein the driving and aging of the light emitting devices is performed in an operation separate from manufacturing of the display apparatus.

9. The electronic equipment according to claim 8, wherein said driving and aging by said drive control unit is performed by entire lighting of said light emitting devices.

10. The electronic equipment according to claim 8, wherein said driving and aging by said drive control unit is performed by displaying a plurality of different image patterns while changing said image patterns at an interval of short time.

11. The electronic equipment according to claim 8, wherein said display apparatus comprises arrayed light emitting devices of respective colors of R, G and B, and said drive control unit drives and ages said light emitting devices of said colors of R, G and B only for said integral driving time set for each of said colors of R, G and B.

12. The electronic equipment according to claim 8, wherein said display apparatus comprises arrayed light emitting devices of respective colors of R, G and B, and said drive control unit drives and ages said light emitting devices of one of said colors of R, G and B with luminance different from that for said light emitting devices of another of said colors.

13. The electronic equipment according to claim 8, wherein said drive control unit is actuated when a charging power supply of a secondary battery for supplying driving power to said electronic equipment is in connection to said electronic equipment.

14. The electronic equipment according to claim 8, wherein a user can interrupt aging during said integral driving time.

15. The electronic equipment according to claim 8, further comprising a unit for clearly showing a user of said electronic equipment that said drive control unit is operating.

16. The electronic equipment according to claim 8, wherein said light emitting devices are organic EL devices.

17. The electronic equipment according to claim 8, wherein the aging request operation is initiated directly by an end user of the display apparatus.

18. A method for aging a display apparatus having light emitting devices arrayed, comprising,
setting an integral driving time for said light emitting devices based on a property of luminance deterioration of said light emitting devices relative to said integral driving time so that lowering of luminance per unit time becomes not larger than a set value;
driving and aging said light emitting devices, only for said set integral driving time, upon an aging request operation; and
prior to driving and aging the light emitting device, selecting whether the driving and aging process or normal use should be given priority.

19. Electronic equipment comprising:
a display apparatus comprising light emitting devices;
a drive control unit actuated in an initial stage of use of said electronic equipment so as to drive and age said light emitting devices while integrating a driving time of said light emitting devices after initial driving;
wherein an integral driving time of said light emitting devices is set based on a property of luminance deterioration of said light emitting devices relative to said integral driving time so that lowering of luminance per unit time becomes not larger than a set value, and
said drive control unit is actuated, upon an aging request operation, until the driving time integrated by said drive control unit comes to said set integral driving time; and
a selection menu to select whether the driving and aging process or normal use should be given priority.

* * * * *